US009387521B2

United States Patent
Shih et al.

(10) Patent No.: US 9,387,521 B2
(45) Date of Patent: Jul. 12, 2016

(54) METHOD OF WET CLEANING ALUMINUM CHAMBER PARTS

(71) Applicant: Lam Research Corporation, Fremont, CA (US)

(72) Inventors: Hong Shih, Walnut, CA (US); Fan-Cheung Sze, Fremont, CA (US); Brian McMillin, Pleasanton, CA (US); John Daugherty, Fremont, CA (US); Yan Fang, Fremont, CA (US); Duane Outka, Fremont, CA (US); Tuochuan Huang, Saratoga, CA (US); Sivakami Ramanathan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 386 days.

(21) Appl. No.: 14/041,385

(22) Filed: Sep. 30, 2013

(65) Prior Publication Data

US 2014/0150819 A1 Jun. 5, 2014

Related U.S. Application Data

(60) Provisional application No. 61/733,775, filed on Dec. 5, 2012.

(51) Int. Cl.
| | | |
|---|---|---|
| *B08B 7/04* | (2006.01) | |
| *B08B 7/02* | (2006.01) | |
| *B24C 1/00* | (2006.01) | |
| *B08B 7/00* | (2006.01) | |
| *H01L 21/67* | (2006.01) | |

(52) U.S. Cl.
CPC ............... *B08B 7/04* (2013.01); *B08B 7/0021* (2013.01); *B24C 1/003* (2013.01); *H01L 21/67051* (2013.01); *B08B 7/028* (2013.01)

(58) Field of Classification Search
CPC ........ B24C 1/003; B08B 7/0021; B08B 7/04; H01J 37/32862
See application file for complete search history.

(56) References Cited

U.S. PATENT DOCUMENTS

| | | | | |
|---|---|---|---|---|
| 7,052,553 B1 * | 5/2006 | Shih | ........................ | B08B 3/12 134/1 |
| 2002/0066466 A1 * | 6/2002 | Tan | ..................... | C23C 16/4407 134/3 |
| 2003/0172952 A1 * | 9/2003 | Takase | ..................... | B08B 7/04 134/1 |
| 2003/0190870 A1 * | 10/2003 | Shih | ........................ | B08B 3/08 451/39 |
| 2008/0223401 A1 * | 9/2008 | Augustino | .......... | C23C 16/4405 134/3 |
| 2009/0056745 A1 * | 3/2009 | Sun | ........................ | C11D 7/08 134/3 |
| 2010/0139692 A1 * | 6/2010 | Avoyan | ..................... | B08B 3/08 134/3 |

* cited by examiner

*Primary Examiner* — Nicole Blan
*Assistant Examiner* — Natasha Campbell
(74) *Attorney, Agent, or Firm* — Beyer Law Group LLP

(57) ABSTRACT

A method of wet cleaning an aluminum part having bare aluminum surfaces and anodized aluminum surfaces. The method includes $CO_2$ dry ice blasting the surfaces of the aluminum part at approximately 35 to approximately 45 psi, masking the aluminum part to conceal the bare aluminum surfaces, soaking the dry ice blasted and masked aluminum part in deionized water at or above approximately 60° C., scrubbing the aluminum part with an abrasive pad and deionized water after completion of the soaking in deionized water, and repeating the soaking and scrubbing in the recited order at least three additional times.

20 Claims, 2 Drawing Sheets

METHOD OF WET CLEANING ALUMINUM CHAMBER PARTS

CROSS-REFERENCE TO RELATED APPLICATION

This application claims the benefit of U.S. Provisional Application No. 61/733,775, filed Dec. 5, 2012.

BRIEF SUMMARY

The present disclosure relates generally to methods of cleaning and, more particularly, to methods of wet cleaning aluminum parts of an etching chamber having bare aluminum surfaces and anodized aluminum surfaces. Although the methods of the present disclosure are not limited to particular chamber part compositions, for the purposes of illustration, the method steps are illustrated herein with reference to aluminum components. It is contemplated that the methods of the present disclosure will also enjoy utility in wet cleaning chamber parts of other compositions, including ceramics.

In accordance with one embodiment of the present disclosure, a method of wet cleaning an aluminum part having bare aluminum surfaces and anodized aluminum surfaces is disclosed. The method includes the steps of $CO_2$ dry ice blasting at approximately 35 to approximately 45 psi the surfaces of the aluminum part, masking the aluminum part to conceal the bare aluminum surfaces, soaking the dry ice blasted and masked aluminum part in deionized water at or above approximately 60° C., scrubbing the aluminum part with an abrasive pad and deionized water after completion of the soaking in deionized water, and repeating the soaking and scrubbing in the recited order at least three additional times.

In accordance with another embodiment of the present disclosure, a method of wet cleaning an aluminum part having bare aluminum surfaces and anodized aluminum surfaces is disclosed. The method includes the steps of $CO_2$ dry ice blasting at approximately 35 to approximately 45 psi for approximately 5 to approximately 10 minutes the surfaces of the aluminum part, flushing the dry ice blasted surfaces of the aluminum part to be cleaned with deionized water at approximately 30 to approximately 40 psi and subsequently drying the aluminum part, wiping the flushed surfaces of the aluminum part with isopropyl alcohol, wiping the flushed surfaces of the aluminum part with acetone, rinsing the wiped aluminum part with deionized water and subsequently removing excess deionized water with compressed dry air, masking the aluminum part to conceal the bare aluminum surfaces, soaking the masked aluminum part in approximately 30 wt % $H_2O_2$ solution for approximately 30 minutes followed by a rinse with deionized water, scrubbing the anodized aluminum surfaces of the masked aluminum part for approximately 6 minutes with a #360 diamond pad and deionized water followed by a deionized rinse and blowing off of excess deionized water, soaking the masked aluminum part in a solution comprising $NH_4OH$, $H_2O_2$, and $H_2O$ for approximately 15 minutes followed by a deionized water rinse, scrubbing the anodized aluminum surfaces of the masked aluminum part for approximately 8 minutes with a #360 diamond pad and deionized water, scrubbing edges and corners of the masked aluminum part with a non-woven fiber scouring pad and deionized water followed by a deionized rinse, performing at least one additional repetition of scrubbing anodized aluminum surfaces of the masked aluminum part for approximately 8 minutes with a #360 diamond pad and deionized water and scrubbing the edges and corners of the aluminum part with a non-woven fiber scouring pad and deionized water followed by a deionized water rinse, subsequently performing at least two repetitions of soaking the aluminum part in deionized water at or above approximately 65° C. for approximately 45 minutes followed by scrubbing anodized aluminum surfaces of the aluminum part with #360 diamond pad and deionized water, subsequently performing at least two repetitions of soaking the aluminum part in deionized water at or above approximately 65° C. for approximately 45 minutes followed by scrubbing anodized aluminum surfaces of the aluminum part with a non-woven fiber scouring pad and deionized water, rinsing the aluminum part with deionized water, flushing the anodized aluminum surfaces of the rinsed aluminum part for approximately 10 to approximately 20 minutes using deionized water at or above 96° C., scrubbing the anodized aluminum surfaces of the flushed aluminum part using #360 diamond pad and deionized water followed by rinsing with deionized water and drying of the aluminum part, wiping the scrubbed aluminum part with a 2 wt % $HNO_3$ solution for approximately 2 minutes and rinsing the aluminum part with deionized water for approximately 2 minutes followed by blowing off excess deionized water, wiping the aluminum part with a dilute sulfuric peroxide comprising approximately 5 vol % of approximately 98 wt % $H_2SO_4$, approximately 5 vol % of approximately 30 wt % $H_2O_2$, and approximately 90 vol % deionized water for approximately 2 minutes followed by rinsing with deionized water for approximately 2 minutes and blowing off of excess water, removing the masking from the bare aluminum surfaces, wiping the surfaces of the unmasked aluminum part with isopropyl alcohol, wiping the surfaces of the unmasked aluminum part with acetone, scrubbing the bare aluminum surfaces with a #3000 grit non-woven fiber scouring pad and deionized water, rinsing the surfaces of the aluminum part with deionized water for approximately 2 minutes followed by blowing off excess deionized water, rinsing the surfaces of the unmasked aluminum part with ultrapure water for approximately 2 minutes followed by ultrasonic cleaning for approximately 20 minutes at a power density of approximately 8 to approximately 15 $W/in^2$, and rinsing the aluminum part with deionized water for approximately 2 minutes followed by drying of the aluminum part.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
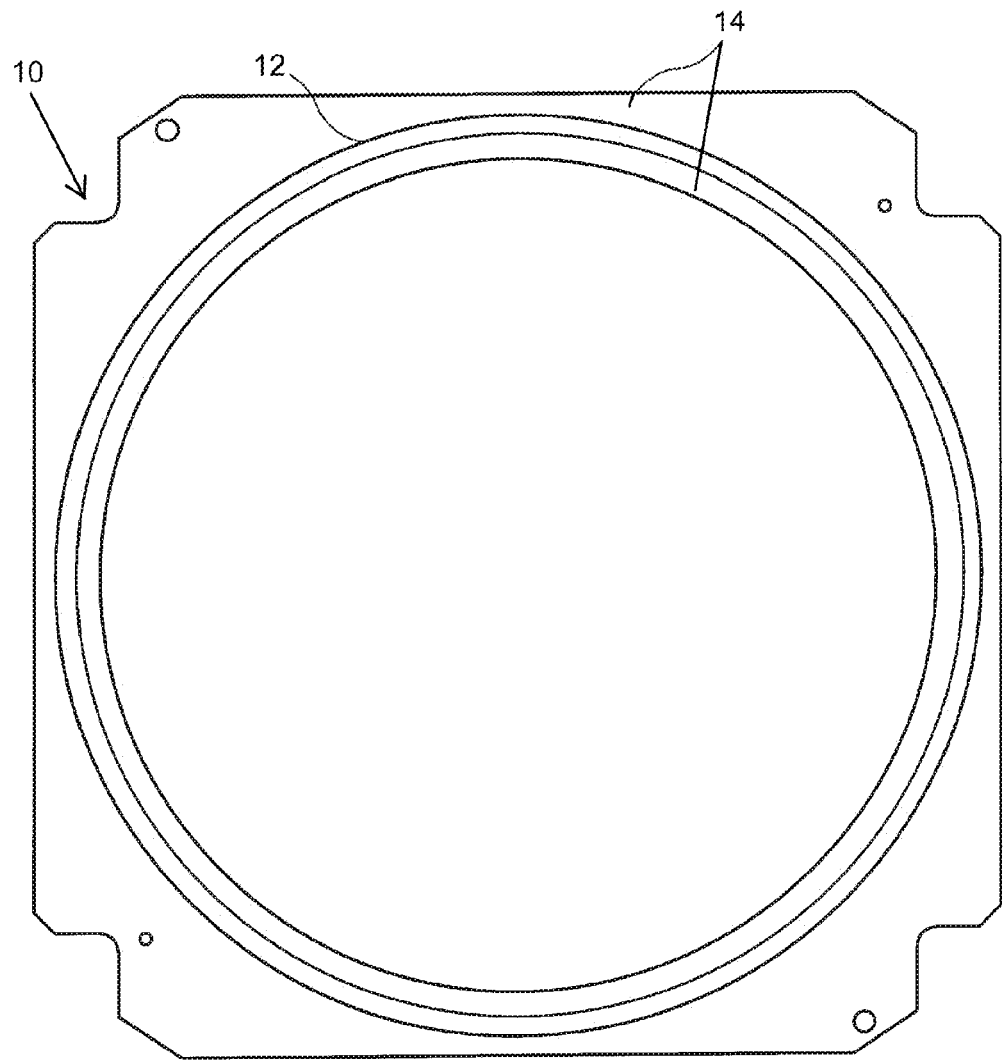
FIG. 1 is an example aluminum part in accordance with the present disclosure.

When exposed to air at room temperature, or any other gas containing oxygen, pure aluminum self-passivates by forming a surface layer of amorphous aluminum oxide 2 to 3 nm thick. The surface layer of aluminum oxide provides very effective protection against corrosion. Anodizing is an electrolytic passivation process used to increase the thickness of the natural oxide layer on the surface of metal parts. The last step in the anodizing process is a sealing process. The main reason for the sealing processes is to close the porous aluminum oxide layer after the anodizing step. Without a high quality sealing, the anodic coating feels sticky and is highly absorbent to contaminant such as dirt, grease, oil and stains. The sealing improves corrosion resistance, but reduces the wear resistance of the anodized oxide layer.

Sealing of an anodized part may be done with a hot deionized water sealing process. The anodized part is immersed into deionized water in the range of 96-100° C. (205-212° F.). The hot deionized water results in the formation of a hydrated aluminum oxide named boehmite (AlOOH), in the pores of the anodized aluminum. The process of filling the pores with boehmite begins by the precipitation of hydrated aluminum oxide as a gel of pseudoboehmite. This precipitation is controlled by diffusion, pH and chemical composition of the sealing solution. During the last period of sealing this pseudo-boehmite recrystallizes to form boehmite starting at the surface. The hydrated aluminum oxide (boehmite) has a greater volume than the aluminum oxide. The formation of boehmite is in accordance with the following chemical formula.

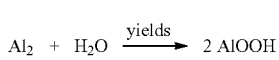

(1)

A sealed anodized aluminum part has boehmite readily available for reaction across its surface and filling its pores. In the presence of fluorine radicals ($F^-$), boehmite will react to form aluminum oxyfluoride (AlOF). The reaction is thermodynamically favorable as the change in Gibbs free energy at standard pressure ($\Delta G°$) is negative; for example, $\Delta G°_{300K}=-13.719$ kJ/mol and $\Delta G°_{400k}=-13.851$ kJ/mol. The boehmite and fluorine radical react to form aluminum oxyfluoride in accordance with the following chemical formula.

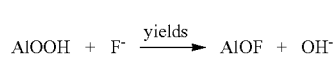

(2)

The presence of aluminum oxyfluoride on the surface of a part is generally not desirable. The aluminum oxyfluoride is believed to interfere with the precision and quality of etching operations. The formation of aluminum oxyfluoride (AlOF), among other fluorinated aluminum and yttrium compositions, is believed to be a cause of etch rate drift and striation during semiconductor processing. However, the reaction of aluminum oxyfluoride and water is thermodynamically favorable. For example, $\Delta G°_{300K}=-689.137$ kJ/mol and $\Delta G°_{400k}=-712.918$ kJ/mol for the reaction of aluminum oxyfluoride and water. The reaction of aluminum oxyfluoride and water results in aluminum oxide ($Al_2O_3$), also commonly called alumina, which may be removed or converted back into boehmite through anodization and sealing. The reaction of aluminum oxyfluoride and water is in accordance with the following chemical formula.

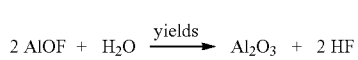

(3)

On an anodized aluminum surface AlOF is the likely reaction product with $F^-$ radicals in the etching chamber. However, on a ceramic surface, such as alumina, $AlF_3$ is the likely reaction product. Removal or conversion of $AlF_3$ is more challenging than removal or conversion of AlOF. Reaction of $AlF_3$ and water is not a thermodynamically favorable reaction. The thermodynamic unfavorability of the reaction of $AlF_3$ and water (Equation 4) is illustrated by the positive Gibbs free energy at standard pressure. For example, for a reaction of $AlF_3$ and water, $\Delta G°_{300K}=+342.534$ kJ/mol and $\Delta G°_{400k}=+269.004$ kJ/mol.

(4)

Since $AlF_3$ reacting with hot deionized water is not thermodynamically favorable, high temperature treatment on the order of 800° C. is necessitated to help remove $AlF_3$. Temperatures on the order of 800° C. help vaporize $AlF_3$ from ceramic surfaces. The temperature is ramped up and ramped down in a controlled manner to avoid ceramic thermo shocks. However, cleaning methods with high temperatures on the order of 800° C. cannot be used on aluminum alloys or on anodized aluminum.

A method of wet cleaning an aluminum part 10 comprising bare aluminum surfaces 12 and anodized aluminum surfaces 14 comprises $CO_2$ dry ice blasting the surfaces of the aluminum part 10, masking the aluminum part 10 to conceal the bare aluminum surfaces 12, soaking the dry ice blasted and masked aluminum part 10 in deionized water (DIW) at or above approximately 60° C., scrubbing the aluminum part 10 with an abrasive pad and deionized water after completion of the soaking in deionized water; and repeating the soaking and scrubbing in the recited order at least three additional times.

Referring to FIG. 1, an example aluminum part 10 is shown. Specifically, FIG. 1 illustrates a liner for semiconductor process chambers. The aluminum part 10 comprises bare aluminum surfaces 12 as well as anodized aluminum surfaces 14, which surfaces are desirable for different functions beyond the scope of the present disclosure. Other aluminum parts 10, such as a pinnacle for semiconductor process chambers, are also envisioned within the scope of the aluminum part 10.

Figure 2:
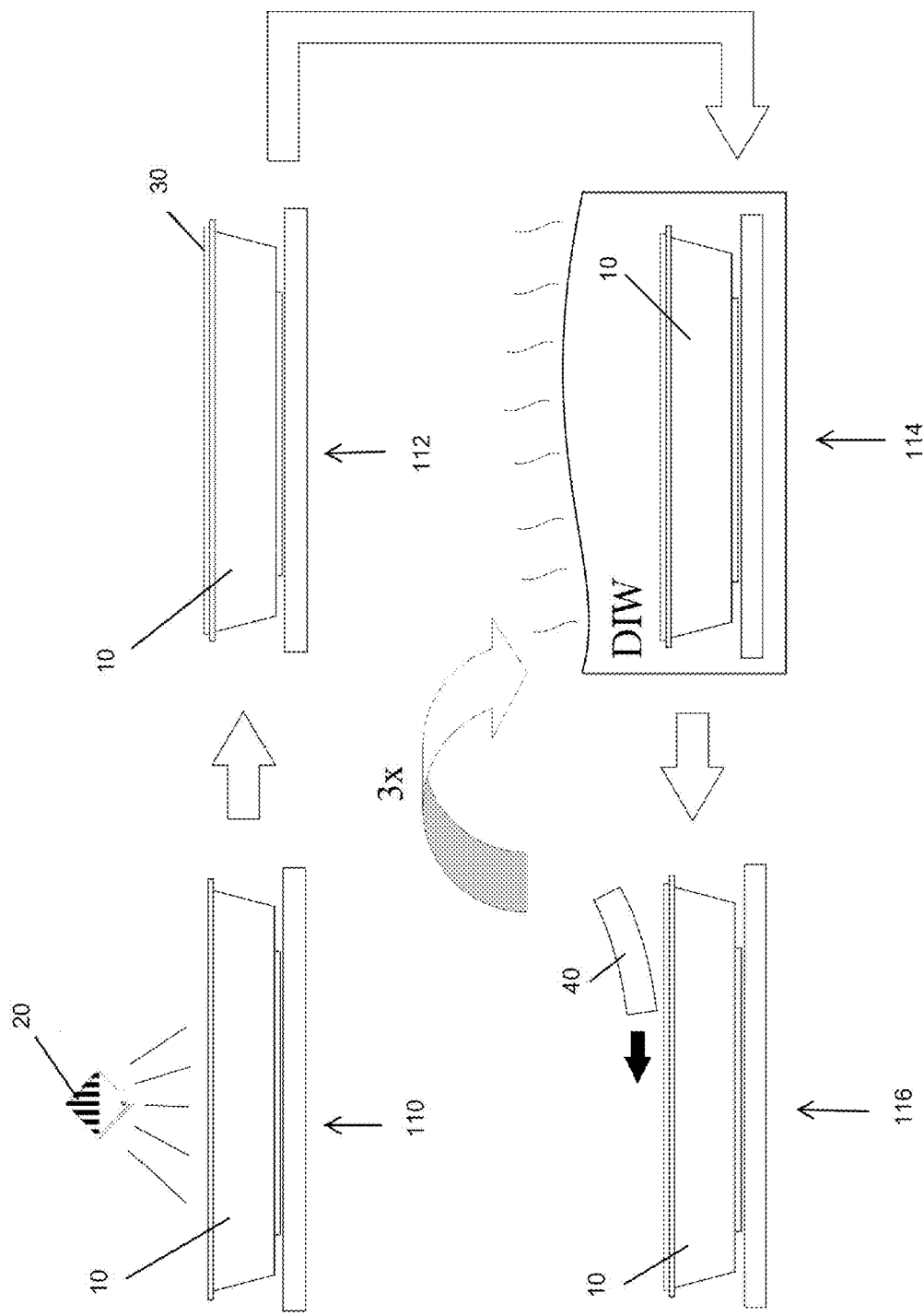
FIG. 2 illustrates a method of wet cleaning an aluminum part according to the present disclosure.

Referring to FIG. 2, a dry ice blasting step 110 is provided. In an embodiment, the $CO_2$ dry ice blasting of the aluminum part 10 is at approximately 35 to approximately 45 psi. Additional, non-exclusive, examples of the $CO_2$ dry ice blasting pressure include approximately 20 psi, approximately 25 psi, approximately 30 psi, approximately 40 psi, approximately 50 psi, approximately 60 psi and all ranges formed from combinations of the disclosed values. The dry ice blasting applies a thermal shock to the aluminum part 10. The thermal shock removes surface polymers, organics, and other depositions on the aluminum part 10.

In an embodiment, the dry ice blasting step 110 is continued for approximately 5 to approximately 10 minutes. In another embodiment, the $CO_2$ dry ice blasting of the aluminum part is continued for approximately 8 to approximately 12 minutes. In another embodiment, the $CO_2$ dry ice blasting of the aluminum part is continued for approximately 5 to approximately 8 minutes. Additional, non-exclusive, examples of the $CO_2$ dry ice blasting duration include approximately 3 minutes, approximately 5 minutes, approximately 8 minutes, approximately 10 minutes, approximately 12 minutes, approximately 15 minutes, and all ranges formed from combinations thereof.

After the dry ice blasting step 110 and prior to masking the aluminum part 10 to conceal the bare aluminum surfaces 12, the method may further comprise flushing the surface of the aluminum part 10 to be cleaned with deionized water in a deionized water flushing step. In one embodiment, the deionized water flush is preferably at approximately 30 psi to approximately 40 psi. Additional, non-exclusive, examples of the deionized water flush pressure include approximately 10 psi, approximately 20 psi, approximately 25 psi, approximately 35 psi, approximately 45 psi, approximately 50 psi, approximately 60 psi and all ranges formed from combinations of the disclosed values. Subsequently, the aluminum part 10 is dried.

After the $CO_2$ dry ice blasting step 110 and the deionized water flushing step, the aluminum part 10 may undergo a chemical wipe step. In an embodiment, the method further comprises wiping all surfaces of the aluminum part 10 with isopropyl alcohol (IPA). In a further embodiment, the method further comprises wiping all surfaces of the aluminum part 10 with acetone. Wiping with isopropyl alcohol and/or acetone removes oils and other contaminates from the aluminum part 10 surfaces. It is contemplated that additional chemical compositions which remove oils or other contaminants from an aluminum surface without undue harm to the aluminum surface known to one skilled in the art may be utilized.

After the chemical wipe step with isopropyl alcohol and/or acetone, in an embodiment, the method further comprises rinsing the aluminum part 10 with deionized water. Excess deionized water is preferably removed from the aluminum part 10, for example with compressed dry air.

The bare aluminum surfaces 12 of the aluminum part 10 are concealed in a masking step 112. The masking step 112 protects the bare aluminum surfaces 12 during further processing of the anodized aluminum surfaces 14. On the anodized aluminum surfaces 14, AlOF is the likely reaction product with $F^-$ radicals present in an etching chamber. Removal of AlOF from an anodized aluminum surface 14 generally involves a different or modified procedure than for removal of contaminants from a bare aluminum surface 12. The masking of the bare aluminum surfaces 12 in the masking step 112 allows processing and treatment specifically directed toward anodized aluminum surfaces 14 without the same processing and treatment being potentially unnecessarily or detrimentally performed on the bare aluminum surfaces 12. The mask 30 for masking of the bare aluminum surfaces 12 may be, for example, a masking tape, a masking paint, or other masking technique known to those skilled in the art.

The dry ice blasted and masked aluminum part is soaked in deionized water at an elevated temperature in a hot DIW soaking step 114. In an embodiment the aluminum part 10 is soaked in deionized water at or above approximately 60° C. Additional, non-exclusive, examples of the deionized water bath temperature include at or above approximately 50° C., at or above approximately 65° C., at or above approximately 70° C., at or above approximately 85° C., at or above approximately 90° C., and at or above approximately 100° C. In an embodiment, the aluminum part 10 is soaked in deionized water at an elevated temperature for approximately 45 minutes during each of the at least four deionized water soaks. Additional, non-exclusive, examples of the duration of the elevated temperature deionized water soaks include approximately 15 minutes, approximately 30 minutes, approximately 60 minutes, and the ranges formed from the combinations of disclosed values.

Soaking the dry ice blasted and masked aluminum part in deionized water at an elevated temperature in the hot DIW soaking step 114, for example at or above approximately 60° C., is believed to convert AlOF to aluminum oxide ($Al_2O_3$). Subsequent scrubbing of the aluminum part 10 with an abrasive pad and deionized water in a scrubbing step 116 after completion of the hot DIW soaking step 114 is believed to remove the converted $Al_2O_3$ from the aluminum surface. Non-exclusive examples of the abrasive pad include a #360 diamond pad, a non-woven fiber scouring pad (such as #3000 grit), and other similarly purposed pads. Repeating the hot DIW soaking step 114 and scrubbing step 116 in the recited order at least three additional times encourages maximum conversion of AlOF to $Al_2O_3$ for removal in the scrubbing step 116.

Subsequent to the CO2 dry ice blasting step 110 and masking step 112, the method may further comprise a $H_2O_2$ soaking step. The $H_2O_2$ soaking step involves, in an embodiment, soaking the aluminum part 10 in approximately 30 wt % $H_2O_2$ solution followed by a rinse with deionized water. Additional, non-exclusive, examples of $H_2O_2$ solution concentration for the $H_2O_2$ soaking step include approximately 20 wt % $H_2O_2$, approximately 25 wt % $H_2O_2$, approximately 35 wt % $H_2O_2$, approximately 40 wt % $H_2O_2$, and the ranges formed from the combinations of disclosed values. In an embodiment, the aluminum part 10 is soaked in the $H_2O_2$ solution for approximately 30 minutes. Additional, non-exclusive, examples of the duration of the $H_2O_2$ solution soak include approximately 15 minutes, approximately 25 minutes, approximately 35 minutes, approximately 45 minutes, and the ranges formed from the combinations of disclosed values. The $H_2O_2$ solution soak facilitates removal of organic compounds as well as oxidizes any exposed aluminum surfaces.

In an embodiment, the $H_2O_2$ soaking step precedes the hot DIW soaking step 114 but is subsequent to the dry ice blasting step 110 and masking step 112.

Subsequent to the dry ice blasting step 110 and masking step 112, the method may further comprise an initial scrubbing step. In an embodiment, the initial scrubbing step involves scrubbing the anodized aluminum surfaces 14 of the aluminum part 10 with an abrasive pad and deionized water followed by a rinse with deionized water. Non-exclusive examples of the abrasive pad include a #360 diamond pad, a non-woven fiber scouring pad (such as #3000 grit), and other similarly purposed pads. In an embodiment, the aluminum part 10 is scrubbed with the abrasive pad for approximately 6 minutes. Additional, non-exclusive, examples of the duration of the abrasive pad scrub include approximately 2 minutes, approximately 4 minutes, approximately 8 minutes, approximately 10 minutes, and the ranges formed from the combinations of disclosed values. The abrasive pad scrub facilitates removal of chemically inert deposits and AlOF, $YF_3$ and $AlF_3$. The presence of AlOF or $AlF_3$ on anodized aluminum surfaces 14 may be determined because of a rainbow color present on the anodized aluminum surfaces 14.

In an embodiment, the initial scrubbing step precedes the hot DIW soaking step 114 but is subsequent to the dry ice blasting step 110 and masking step 112.

Subsequent to the initial scrubbing step, the method further comprises a SC-1 soaking step. In an embodiment, the SC-1 soaking step includes soaking the aluminum part 10 in a solution comprising $NH_4OH$, $H_2O_2$, and $H_2O$ followed by a deionized water rinse. In an embodiment, $NH_4OH$ (approximately 30%), $H_2O_2$ (approximately 30%), and $H_2O$ are mixed at approximately a 1:1:5 ratio by volume. Other ratios, including more dilute formulations, are envisioned. Non-exclusive examples of the duration of the $NH_4OH$, $H_2O_2$, and $H_2O$ soak include approximately 5 minutes, approximately 10 minutes, approximately 15 minutes, approximately 20 minutes, approximately 25 minutes, and the ranges formed from the combinations of disclosed durations.

In an embodiment, subsequent to the SC-1 soaking step, the method further comprises an additional scrubbing of the anodized aluminum surfaces 14 of the aluminum part 10 for approximately 8 minutes with an abrasive pad in a secondary scrubbing step. Additional, non-exclusive, examples of the duration of the secondary scrubbing step include approximately 2 minutes, approximately 4 minutes, approximately 6 minutes, approximately 10 minutes, approximately 12 minutes, and the ranges formed from the combinations of disclosed values. A scrubbing with an abrasive pad is particularly beneficial to the cleaning process because AlOF and $AlF_3$ become part of the anodized aluminum surface 14 and are believed to not be effectively removed by the $CO_2$ dry ice blasting.

In a specific embodiment of the secondary scrubbing step, the anodized aluminum surfaces 14 are generally scrubbed with a #360 diamond pad and deionized water and the edges and corners of the aluminum part 10 are scrubbed with a non-woven fiber scouring pad and deionized water.

In a further embodiment, the secondary scrubbing step is repeated with a deionized water rinse between the two iterations of the secondary scrubbing step.

In an embodiment, subsequent to the at least 3 repetitions of the hot DIW soaking step 114 and scrubbing step 116, the method further comprises flushing the anodized aluminum surfaces 14 of the aluminum part 10 with deionized water heated to at or above approximately 96° C. in a hot DIW sealing step. The flushing of the aluminum part 10 with deionized water at or above 96° C. is continued for approximately 10 to approximately 20 minutes. Additional, non-exclusive, examples of the duration of the deionized water flushing include approximately 5 minutes, approximately 15 minutes, approximately 25 minutes, approximately 30 minutes, and the ranges formed from the combinations of disclosed values. The flushing with deionized water at or above approximately 96° C. in the hot DIW sealing step simulates the hot deionized water seal in an anodization process and achieves a similar surface condition.

Subsequent to the flushing and the hot DIW sealing step, the method may further comprise a tertiary scrubbing step. In an embodiment, the tertiary scrubbing step includes scrubbing the anodized surfaces 14 of the aluminum part 10 using an abrasive pad, a #360 diamond pad for example, and deionized water followed by a deionized water rinse and drying, with blown air for example.

Subsequent to the at least 3 repetitions of the hot DIW soaking step 114 and the scrubbing step 116, the method may further comprise a $HNO_3$ wiping step. In an embodiment, the $HNO_3$ wiping step includes wiping the aluminum part 10 with an approximately 2 wt % $HNO_3$ solution. Additional, non-exclusive, examples of $HNO_3$ solution concentration include approximately 1 wt % $HNO_3$, approximately 3 wt % $HNO_3$, approximately 4 wt % $HNO_3$, approximately 5 wt % $HNO_3$, and the ranges formed from the combinations of disclosed values. In an embodiment, the aluminum part 10 is wiped with the $HNO_3$ solution for approximately 2 minutes. Additional, non-exclusive, examples of the duration of the $HNO_3$ solution wipe include approximately 1 minute, approximately 3 minutes, approximately 5 minutes, approximately 10 minutes, and the ranges formed from the combinations of disclosed values. The $HNO_3$ wiping step facilitates removal of contaminant metals from the anodized aluminum surface 14 of the aluminum part 10. Subsequently, the aluminum part 10 is rinsed with deionized water for approximately 2 minutes followed by removal of excess deionized water, for example with a stream of dry compressed air. Additional, non-exclusive, examples of the duration of the deionized water rinse include approximately 1 minute, approximately 3 minutes, approximately 5 minutes, approximately 10 minutes, and the ranges formed from the combinations of disclosed values.

In an embodiment, subsequent to the hot DIW soaking step 114 and the scrubbing step 116, the method further comprises wiping the aluminum part with a dilute sulfuric peroxide in a sulfuric peroxide wiping step. The dilute sulfuric peroxide may, for example, comprise approximately 5 vol % of 98 wt % $H_2SO_4$, approximately 5 vol % of 30 wt % $H_2O_2$, and approximately 90 vol % deionized water. Other formulations of dilute sulfuric peroxide known to one skilled in the art are also envisioned. The aluminum part 10 is wiped with the dilute sulfuric peroxide for approximately 2 minutes. Additional, non-exclusive, examples of the duration of the dilute sulfuric peroxide solution wipe include approximately 1 minute, approximately 3 minutes, approximately 5 minutes, approximately 10 minutes, and the ranges formed from the combinations of disclosed values. After the sulfuric peroxide wiping step the aluminum part 10 is rinsed with deionized water for approximately 2 minutes and the excess deionized water is removed, for example with a stream of compressed dry air. Additional, non-exclusive, examples of the duration of the deionized water rinse include approximately 1 minute, approximately 3 minutes, approximately 5 minutes, approximately 10 minutes, and the ranges formed from the combinations of disclosed values. The sulfuric peroxide solution wiping step facilitates removal of contamination metals and $YF_3$.

In an embodiment the method further comprises removing the masking from the bare aluminum surfaces 12 in a demasking step after intermediate cleaning of the anodized aluminum surfaces 14. In an embodiment, the masking 30 is removed subsequent to the sulfuric peroxide wiping step and deionized water rinse.

In an embodiment, the method further comprises wiping the surfaces of the unmasked aluminum part 10 with isopropyl alcohol and additionally wiping the surfaces of the unmasked aluminum part 10 with acetone in a demasked wiping step.

In an embodiment, the method further comprises scrubbing the acetone and/or isopropyl alcohol wiped bare aluminum surfaces 12 with an abrasive pad, for example a #300 grit non-woven fiber scouring pad in a quaternary scrubbing step. After the bare aluminum surfaces 12 of the aluminum part 10 are scrubbed, the aluminum part 10 is rinsed with deionized water for approximately 2 minutes and the excess deionized water is removed, for example with a stream of compressed dry air. Additional, non-exclusive, examples of the duration of the deionized water rinse include approximately 1 minute, approximately 3 minutes, approximately 5 minutes, approximately 10 minutes, and the ranges formed from the combinations of disclosed values.

In an embodiment, the method further comprises rinsing the surfaces of the unmasked aluminum part 10 with ultrapure water (UPW) for approximately 2 minutes in an ultrapure water rinsing step. Additional, non-exclusive, examples of the duration of the ultrapure water rinse include approximately 1 minute, approximately 3 minutes, approximately 5 minutes, approximately 10 minutes, and the ranges formed from the combinations of disclosed values.

In an embodiment, the method further comprises ultrasonic cleaning of the aluminum part 10 for approximately 20 minutes at a power density of approximately 8 $W/in^2$ to approximately 15 $W/in^2$ in an ultrasonic cleaning step. Additional, non-exclusive, examples of the duration of the ultrasonic cleaning step include approximately 10 minute, approximately 15 minutes, approximately 25 minutes, approximately 30 minutes, and the ranges formed from the combinations of disclosed values. Additional, non-exclusive, examples of the ultrasonic cleaning power density include approximately 5 W/in$^2$, approximately 12 W/in$^2$, approximately 18 W/in$^2$, approximately 24 W/in$^2$, and the ranges formed from the combinations of disclosed values.

The elements of the various disclosed embodiments may be combined, in part or in whole, to form additional more expansive wet cleaning methods. An example of such an expansive wet cleaning method is:

$CO_2$ dry ice blasting at 35-45 psi on aluminum surface for 5 to 10 minutes;
deionized water flushing at 30-40 psi;
blow drying;
isopropyl alcohol wiping;
acetone wiping;
deionized water rinsing;
blow off excess deionized water with compressed dry air;
masking bare aluminum surface 12;
soaking in 30 wt % $H_2O_2$ solution for 30 minutes;
deionized rinsing;
scrub anodized aluminum surface 14 for 6 minutes with #360 diamond pad and deionized water;
deionized water rinsing;
blow off excess deionized water with compressed dry air;
soaking in $NH_4OH/H_2O_2/H_2O$ solution for 15 minutes;
deionized water rinsing;
scrub anodized aluminum surface 14 for 8 minutes with #360 diamond pad and deionized water;
scrub edges and corners of aluminum part 10 with non-woven fiber scouring pad and deionized water;
deionized water rinsing;
repeat scrub of anodized aluminum surface 14 for 8 minutes with #360 diamond pad and deionized water, scrub of edges and corners of aluminum part 10 with non-woven fiber scouring pad and deionized water, and deionized water rinsing;
soak in hot deionized water at 65° C. or higher for 45 minutes;
scrub anodized aluminum surfaces with #360 diamond pad and deionized water;
repeat 3 additional times the soak in hot deionized water at 65° C. or higher for 45 minutes and scrub anodized aluminum surfaces with #360 diamond pad and deionized water;
deionized water rinsing;
hot deionized water at 96° C. or higher flush of anodized aluminum surfaces 14 for 10 to 20 minutes;
scrub anodized aluminum surface 14 with #360 diamond pad and deionized water;
deionized water rinsing;
blow drying;
inspect the surfaces and make sure that rainbow color is fully removed as indicative of AlOF and $AlF_3$ removal;
2 wt % $HNO_3$ solution wiping for 2 minutes;
deionized water rinsing for 2 minutes;
blow off excess deionized water with compressed dry air;
dilute sulfuric peroxide [5 vol % $H_2SO_4$ acid (98%)+5 vol % $H_2O_2$ (30%)+90 vol % deionized water) wipe for 2 minutes;
deionized water rinsing for 2 minutes;
blow off excess deionized water with compressed dry air;
remove bare aluminum surface mask;
isopropyl alcohol wiping;
acetone wiping;
clean bare aluminum surfaces 12 with non-woven scouring pad and deionized water;
deionized water rinsing for 2 minutes;
blow off excess deionized water with compressed dry air;
transfer parts into class 1000 or better clean room;
ultrapure water rinsing for 2 minutes;
ultrasonic cleaning for 20 minutes at 8-15 W/in$^2$ power density;
deionized water rinsing for 2 minutes;
blow drying;
bake in cleanroom oven at 105° C. for 90 minutes; and
package.

Specific aluminum parts intended for cleaning with the wet cleaning method include anodized aluminum liners for semiconductor process chambers, Lam Research part number 715-042721-100 for example, and anodized aluminum pinnacles for semiconductor process chambers, Lam Research part number 715-075674-001 for example. Such aluminum parts may be formed of aluminum 6061 alloy with a composition of:

| Element | wt % |
|---------|------|
| Si | 0.40-0.8 |
| Fe | 0.7 maximum |
| Cu | 0.15-0.40 |
| Mg | 0.8-1.2 |
| Mn | 0.15 |
| Cr | 0.04-0.35 |
| Zn | 0.25 |
| Ti | 0.15 |
| others | 0.05-0.15 |
| Al | remainder |

In most cases, the aforementioned parts contain Fe levels from 0.12 wt % to 0.38 wt %; below the 0.7 wt % maximum.

Implementation of an embodiment of the method of wet cleaning demonstrates the removal of F ions, Y atoms, and Si atoms to return a used and contaminated aluminum part back to the ranges of newly manufactured aluminum parts.

Surface Metal Contamination Levels of F Ions (ions/cm$^2$)

| | New Part | Pre-Cleaning | Post-Cleaning |
|---|---|---|---|
| Liner (Anodized Aluminum) | ≤3.0E13 ions/cm$^2$ | 2.4E16 ions/cm$^2$ | 3.0E13 ions/cm$^2$ |
| Pinnacle (Anodized Aluminum) | ≤3.0E13 ions/cm$^2$ | 1.5E16 ions/cm$^2$ | 5.0E13 ions/cm$^2$ |

Surface Metal Contamination Levels of Y (atoms/cm$^2$)

| | New Part | Post-Cleaning |
|---|---|---|
| Liner (Anodized Aluminum) | 3.3E12 atoms/cm$^2$ | 2.6E13 atoms/cm$^2$ |
| Pinnacle (Anodized Aluminum) | 2.0E12 atoms/cm$^2$ | 5.2E13 atoms/cm$^2$ |

Surface Metal Contamination Levels of Si (atoms/cm$^2$)

| | New Part | Post-Cleaning |
|---|---|---|
| Liner (Anodized Aluminum) | 6.0E14 atoms/cm$^2$ | 1.2E14 atoms/cm$^2$ |
| Pinnacle (Anodized Aluminum) | 7.8E14 atoms/cm$^2$ | 1.5E14 atoms/cm$^2$ |

It is noted that recitations herein of "at least one," should not be used to create an inference that the alternative use of the articles "a" or "an" should be limited to a single instance.

It is noted that the term "subsequent," and variants thereof, when utilized herein, does not necessarily mean immediately following. The term "subsequent" is used to indicate that a step occurs later in time and leaves open the possibility of intervening steps.

It is noted that terms like "preferably" and similar terms when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

What is claimed is:

1. A method of wet cleaning an aluminum part comprising bare aluminum surfaces and anodized aluminum surfaces, the method comprising:
   $CO_2$ dry ice blasting at approximately 35 to approximately 45 psi the surfaces of the aluminum part;
   masking the aluminum part to conceal the bare aluminum surfaces;
   soaking the dry ice blasted and masked aluminum part in deionized water at or above approximately 60° C;
   scrubbing the aluminum part with an abrasive pad and deionized water after completion of the soaking in deionized water; and
   repeating the soaking and scrubbing in the recited order at least three additional times.

2. The method of claim 1, wherein the CO2 dry ice blasting is continued for approximately 5 to approximately 10 minutes.

3. The method of claim 1, wherein subsequent to the $CO_2$ dry ice blasting the method further comprises flushing the surface of the aluminum part to be cleaned with deionized water at approximately 30 to approximately 40 psi and subsequently drying the aluminum part.

4. The method of claim 3, wherein subsequent to the deionized water flush the method further comprises wiping all surfaces of the aluminum part with isopropyl alcohol, acetone, or isopropyl alcohol and acetone; and
   rinsing the aluminum part with deionized water and subsequently removing excess deionized water with compressed dry air.

5. The method of claim 1, wherein subsequent to the $CO_2$ dry ice blasting the method further comprises soaking the aluminum part in approximately 30 wt % $H_2O_2$ solution for approximately 30 minutes followed by a rinse with deionized water.

6. The method of claim 5, wherein the soaking in approximately 30 wt % $H_2O_2$ solution precedes the soaking in deionized water at or above approximately 60° C.

7. The method of claim 1, wherein subsequent to the $CO_2$ dry ice blasting the method further comprises scrubbing anodized aluminum surfaces of the aluminum part for approximately 6 minutes with a #360 diamond pad and deionized water followed by a deionized rinse and blowing off of excess deionized water.

8. The method of claim 7, wherein the scrubbing of the anodized aluminum surfaces of the aluminum part precedes the soaking in deionized water at or above approximately 60° C.

9. The method of claim 7, wherein subsequent to the scrubbing of the anodized aluminum surfaces of the aluminum part the method further comprises:
   soaking the aluminum part in a solution comprising $NH_4OH$, $H_2O_2$, and $H_2O$ for approximately 15 minutes followed by a deionized water rinse; and
   scrubbing anodized aluminum surfaces of the aluminum part for approximately 8 additional minutes with a #360 diamond pad and deionized water.

10. The method of claim 9, wherein the method further comprises scrubbing edges and corners of the aluminum part with a non-woven fiber scouring pad and deionized water followed by a deionized water rinse.

11. The method of claim 1, wherein the aluminum part is soaked in deionized water at or above approximately 65° C.

12. The method of claim 11, wherein the aluminum part is soaked in deionized water at or above approximately 65° C. for approximately 45 minutes during each soaking.

13. The method of claim 1, wherein subsequent to the at least 3 repetitions of the soaking and the scrubbing of the aluminum part with an abrasive pad, the method further comprises:
   flushing anodized aluminum surfaces of the aluminum part for approximately 10 to approximately 20 minutes using deionized water at or above approximately 96° C; and
   scrubbing anodized aluminum surfaces of the aluminum part using #360 diamond pad and deionized water followed by rinsing with deionized water and drying of the aluminum part.

14. The method of claim 1, wherein subsequent to the at least 3 repetitions of the soaking and the scrubbing of the aluminum part with an abrasive pad, the method further comprises:
   wiping the aluminum part with an approximately 2 wt % $HNO_3$ solution for approximately 2 minutes; and
   rinsing the aluminum part with deionized water for approximately 2 minutes followed by blowing off excess deionized water.

15. The method of claim 1, wherein subsequent to the at least 3 repetitions of the soaking and the scrubbing the aluminum part with an abrasive pad, the method further comprises wiping the aluminum part with a dilute sulfuric peroxide comprising approximately 5 vol % of 98 wt % $H_2SO_4$, approximately 5 vol % of 30 wt % $H_2O_2$, and approximately 90 vol % deionized water for approximately 2 minutes followed by rinsing with deionized water for approximately 2 minutes and blowing off of excess water.

16. The method of claim 15, wherein subsequent to the dilute sulfuric peroxide wipe and deionized water rinse, the method further comprises removing the masking from the bare aluminum surfaces.

17. The method of claim 1, wherein the method further comprises removing the masking from the bare aluminum surfaces and wiping the surfaces of the unmasked aluminum part with isopropyl alcohol and wiping the surfaces of the unmasked aluminum part with acetone.

18. The method of claim 1, wherein the method further comprises removing the masking from the bare aluminum surfaces and scrubbing the bare aluminum surfaces with a #3000 grit non-woven fiber scouring pad and deionized water and rinsing the surfaces of the aluminum part with deionized water for approximately 2 minutes followed by blowing off excess deionized water.

19. The method of claim 1, wherein the method further comprises removing the masking from the bare aluminum surfaces and rinsing the surfaces of the unmasked aluminum part with ultrapure water for approximately 2 minutes followed by ultrasonic cleaning for approximately 20 minutes at a power density of approximately 8 to approximately 15 W/in$^2$.

20. A method of wet cleaning an aluminum part having bare aluminum surfaces and anodized aluminum surfaces, the method comprising:

$CO_2$ dry ice blasting at approximately 35 to approximately 45 psi for approximately 5 to approximately 10 minutes the surfaces of the aluminum part;

flushing the dry ice blasted surfaces of the aluminum part to be cleaned with deionized water at approximately 30 to approximately 40 psi and subsequently drying the aluminum part;

wiping the flushed surfaces of the aluminum part with isopropyl alcohol;

wiping the flushed surfaces of the aluminum part with acetone;

rinsing the wiped aluminum part with deionized water and subsequently removing excess deionized water with compressed dry air;

masking the aluminum part to conceal the bare aluminum surfaces;

soaking the masked aluminum part in approximately 30 wt % $H_2O_2$ solution for approximately 30 minutes followed by a rinse with deionized water;

scrubbing the anodized aluminum surfaces of the masked aluminum part for approximately 6 minutes with a #360 diamond pad and deionized water followed by a deionized rinse and blowing off of excess deionized water;

soaking the masked aluminum part in a solution comprising $NH_4OH$, $H_2O_2$, and $H_2O$ for approximately 15 minutes followed by a deionized water rinse;

scrubbing the anodized aluminum surfaces of the masked aluminum part for approximately 8 minutes with a #360 diamond pad and deionized water;

scrubbing edges and corners of the masked aluminum part with a non-woven fiber scouring pad and deionized water followed by a deionized rinse;

performing at least one additional repetition of scrubbing anodized aluminum surfaces of the masked aluminum part for approximately 8 minutes with a #360 diamond pad and deionized water and scrubbing the edges and corners of the aluminum part with a non-woven fiber scouring pad and deionized water followed by a deionized water rinse;

subsequently performing at least two repetitions of soaking the aluminum part in deionized water at or above approximately 65° C. for approximately 45 minutes followed by scrubbing anodized aluminum surfaces of the aluminum part with #360 diamond pad and deionized water;

subsequently performing at least two repetitions of soaking the aluminum part in deionized water at or above approximately 65° C. for approximately 45 minutes followed by scrubbing anodized aluminum surfaces of the aluminum part with a non-woven fiber scouring pad and deionized water;

rinsing the aluminum part with deionized water;

flushing the anodized aluminum surfaces of the rinsed aluminum part for approximately 10 to approximately 20 minutes using deionized water at or above 96° C;

scrubbing the anodized aluminum surfaces of the flushed aluminum part using #360 diamond pad and deionized water followed by rinsing with deionized water and drying of the aluminum part;

wiping the scrubbed aluminum part with a 2 wt % $HNO_3$ solution for approximately 2 minutes and rinsing the aluminum part with deionized water for approximately 2 minutes followed by blowing off excess deionized water;

wiping the aluminum part with a dilute sulfuric peroxide comprising approximately 5 vol % of approximately 98 wt % $H_2SO_4$, approximately 5 vol % of approximately 30 wt % $H_2O_2$, and approximately 90 vol % deionized water for approximately 2 minutes followed by rinsing with deionized water for approximately 2 minutes and blowing off of excess water;

removing the masking from the bare aluminum surfaces;

wiping the surfaces of the unmasked aluminum part with isopropyl alcohol;

wiping the surfaces of the unmasked aluminum part with acetone;

scrubbing the bare aluminum surfaces with a #3000 grit non-woven fiber scouring pad and deionized water;

rinsing the surfaces of the aluminum part with deionized water for approximately 2 minutes followed by blowing off excess deionized water;

rinsing the surfaces of the unmasked aluminum part with ultrapure water for approximately 2 minutes followed by ultrasonic cleaning for approximately 20 minutes at a power density of approximately 8 to approximately 15 W/in$^2$; and rinsing the aluminum part with deionized water for approximately 2 minutes followed by drying of the aluminum part.

* * * * *